(12) United States Patent
Wong et al.

(10) Patent No.: US 8,462,516 B2
(45) Date of Patent: Jun. 11, 2013

(54) INTERCONNECT STRUCTURE AND A METHOD OF FABRICATING THE SAME

(75) Inventors: Chee Khuen Stephen Wong, Singapore (SG); Hock Lye John Pang, Singapore (SG); Wei Fan, Singapore (SG); Haijing Lu, Singapore (SG); Boon Keng Lok, Singapore (SG)

(73) Assignees: Agency for Science Technology and Research, Singapore (SG); Nanyang Technological University, Singapore (SG)

( * ) Notice: Subject to any disclaimer, the term of this patent is extended or adjusted under 35 U.S.C. 154(b) by 173 days.

(21) Appl. No.: 12/741,582

(22) PCT Filed: Oct. 21, 2008

(86) PCT No.: PCT/SG2008/000406
§ 371 (c)(1),
(2), (4) Date: Jun. 21, 2010

(87) PCT Pub. No.: WO2009/061282
PCT Pub. Date: May 14, 2009

(65) Prior Publication Data
US 2010/0246150 A1 Sep. 30, 2010

(30) Foreign Application Priority Data
Nov. 6, 2007 (SG) .............................. 200717535-9

(51) Int. Cl.
*H05K 7/02* (2006.01)
*H05K 1/16* (2006.01)
*H05K 7/20* (2006.01)
*H05K 1/09* (2006.01)
*B29C 59/00* (2006.01)

(52) U.S. Cl.
USPC ........... 361/770; 361/760; 361/762; 361/767; 174/254; 174/257; 174/260; 257/737; 257/775; 257/778; 29/843

(58) Field of Classification Search
USPC ................. 361/760, 762, 764, 767, 768, 770, 361/783–785, 790–793, 807; 174/254–267; 257/737, 698, 778, 780, 779, 781, 690, 728, 257/738, 697, 687; 438/613, 614, 106–109, 438/618, 687, 611, 737; 29/825–852
See application file for complete search history.

(56) References Cited

U.S. PATENT DOCUMENTS
4,949,455 A * 8/1990 Nakamura et al. ............... 29/843
5,130,779 A 7/1992 Agarwala et al. ............. 257/772
(Continued)

FOREIGN PATENT DOCUMENTS
EP 0889512 A2 1/1999
EP 1005086 A2 5/2000
EP 1239514 A2 9/2002

*Primary Examiner* — Michail V Datskovskiy
(74) *Attorney, Agent, or Firm* — King & Spalding LLP (57) ABSTRACT

An interconnect structure, an interconnect structure for interconnecting first and second components, an interconnect structure for interconnecting a multiple component stack and a substrate, and a method of fabricating an interconnect structure. The interconnect structure comprising a base portion formed on a mounting surface of a first component; a pillar portion extending from the base portion and substantially perpendicularly to the mounting surface; and a head portion formed on the pillar portion and having larger lateral dimensions than the pillar portion; wherein the base portion and the pillar portion are integrally formed of a homogeneous material.

3 Claims, 10 Drawing Sheets

U.S. PATENT DOCUMENTS

| | | | | |
|---|---|---|---|---|
| 5,334,804 | A | 8/1994 | Love et al. | 174/267 |
| 5,422,516 | A * | 6/1995 | Hosokawa et al. | 257/775 |
| 5,536,362 | A | 7/1996 | Love et al. | 216/13 |
| 5,640,052 | A | 6/1997 | Tsukamoto | 257/781 |
| 5,773,897 | A * | 6/1998 | Wen et al. | 257/778 |
| 5,912,510 | A * | 6/1999 | Hwang et al. | 257/778 |
| 6,097,097 | A | 8/2000 | Hirose | 257/778 |
| 6,153,940 | A | 11/2000 | Zakel et al. | 257/779 |
| 6,271,135 | B1 * | 8/2001 | Palmans et al. | 438/687 |
| 6,300,250 | B1 | 10/2001 | Tsai | 438/694 |
| 6,509,256 | B2 * | 1/2003 | Medlen et al. | 438/618 |
| 6,578,754 | B1 * | 6/2003 | Tung | 228/180.22 |
| 6,592,019 | B2 | 7/2003 | Tung | 228/197 |
| 6,681,982 | B2 * | 1/2004 | Tung | 228/197 |
| 6,731,003 | B2 | 5/2004 | Joshi et al. | 257/737 |
| 6,818,545 | B2 | 11/2004 | Lee et al. | 438/614 |
| 6,884,707 | B1 * | 4/2005 | Cherian | 438/611 |
| 6,917,119 | B2 | 7/2005 | Lee et al. | 257/780 |
| 7,122,897 | B2 * | 10/2006 | Aiba et al. | 257/738 |
| 7,125,789 | B2 | 10/2006 | Tellkamp et al. | 438/614 |
| 7,135,777 | B2 * | 11/2006 | Bakir et al. | 257/773 |
| 7,271,483 | B2 * | 9/2007 | Lin et al. | 257/737 |
| 7,465,089 | B2 * | 12/2008 | Battle | 378/204 |
| 7,713,782 | B2 * | 5/2010 | Pendse | 438/108 |
| 7,863,739 | B2 * | 1/2011 | Lee et al. | 257/737 |
| 7,902,679 | B2 * | 3/2011 | Lin et al. | 257/778 |
| 8,021,921 | B2 * | 9/2011 | Lin et al. | 438/108 |
| 8,093,729 | B2 * | 1/2012 | Trezza | 257/781 |
| 2002/0121692 | A1 | 9/2002 | Lee et al. | 257/737 |
| 2004/0087057 | A1 | 5/2004 | Wang et al. | 438/106 |
| 2004/0126927 | A1 | 7/2004 | Lin et al. | 438/107 |
| 2005/0017376 | A1 | 1/2005 | Tsai | 257/786 |
| 2005/0032349 | A1 | 2/2005 | Lee et al. | 438/614 |
| 2005/0167830 | A1 | 8/2005 | Chang et al. | 257/737 |
| 2005/0194695 | A1 | 9/2005 | Lin et al. | 257/777 |
| 2005/0215043 | A1 | 9/2005 | Lee et al. | 438/612 |
| 2006/0163729 | A1 | 7/2006 | Lin et al. | 257/738 |
| 2006/0220259 | A1 | 10/2006 | Chen et al. | 257/778 |
| 2006/0223313 | A1 * | 10/2006 | Yoon et al. | 438/687 |
| 2007/0228549 | A1 * | 10/2007 | Hsu et al. | 257/698 |
| 2008/0122117 | A1 * | 5/2008 | Pendse | 257/778 |
| 2009/0108443 | A1 * | 4/2009 | Jiang | 257/737 |

* cited by examiner

INTERCONNECT STRUCTURE AND A METHOD OF FABRICATING THE SAME

FIELD OF INVENTION

The present invention relates broadly to an interconnect structure, to an interconnect structure for interconnecting first and second components, to an interconnect structure for interconnecting a multiple component stack and a substrate, and to a method of fabricating an interconnect structure.

BACKGROUND

Bonded wires, solder bumps and metal pillars are common microstructures formed on micro devices which are usually fabricated on silicon wafers. Wire bonding is the earliest technique for interconnecting electronic devices. Thermosonic wire bonding is a commonly used technique. Conventional wire bonding allows Input/Output (I/O) pad bonding only on a chip perimeter near edges of a chip. Low profile and flexible long loop wire can be bonded across multiple chips and substrates. However, the trade-off in long wire interconnection is its high impedance and parasitic inductance and capacitance. Wire bonding is usually not suitable for high frequency and RF applications. Further, wire bonding over an active portion of a silicon chip may damage the delicate circuitry beneath it. This restriction limits the design for optimal power distribution and chip size shrinkage.

Flip-chip technology is an important development for the microelectronic industry. An optimized flip-chip device provides improvement in cost, reliability and performance over a wire-bonded device. The flip-chip device also has better electrical performance and lower impedance, inductance and capacitance. Aided by a self-alignment characteristic of solder, flip-chip packaging using solder bump has excellent yield. An area array interconnection format on flip-chip allows large number of I/Os to be distributed across the chip surface. This improves pitch spacing and power distribution. With no additional packaging material over the bare chip, the flip-chip has the smallest possible size. As the flip-chip array pitch decreases, the interconnect solder bump diameter on the flip-chip may decrease correspondingly.

One disadvantage for reducing a solder bump size is the increase in the volume ratio of the IMC to bulk solder in an interconnecting joint. A higher percentage of the IMC in the solder joint is undesirable as the IMC is brittle and the fatigue life of the solder joint can be reduced. Another disadvantage is the increase in current density as the solder bump size decreases. As current density increases, electromigration will become a reliability concern in package interconnection.

Figure 1:
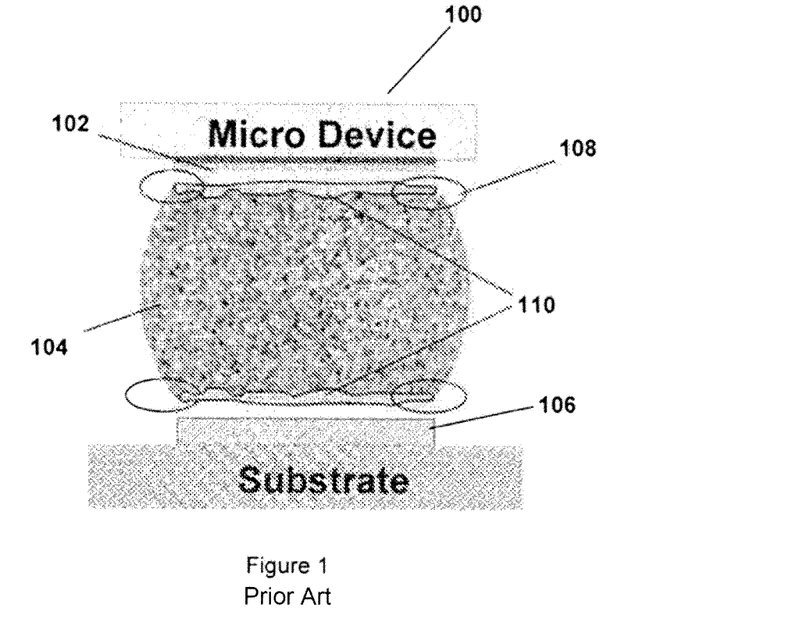
FIG. 1 shows a schematic drawing of a typical solder bump interconnection.

FIG. 1 shows a schematic drawing of a typical solder bump interconnection 100. The typical solder bump interconnection 100 comprises an under-bump-metallization (UBM) 102, a solder bump 104 and a matching substrate bond pad 106. However, the typical solder bump interconnection 100 has several inherent weaknesses. During reflow, the solder bump 104 will collapse and become barrel-shaped upon solidification. This limits the height and pitch of solder joints and applications of the solder bump interconnection 100 in high-density miniaturized packages. Further, truncated spherical ends 108 of the solder bump 104 are the main load bearing points and high stress concentrations occur at these spherical ends 108. UBM 102 interacts with the solder bump 104 and weakens the solder joints. Embrittlement at the IMC-solder interfaces 110 and coefficient of thermal expansion (CTE) mismatch in these IMC-solder interfaces 110 creates node for crack initiation and propagation.

Unlike solder bump, copper (Cu) pillar does not collapse during reflow soldering. Pillars can be packed closer together, increasing the interconnection density. If plating is done directly on the chip metal pads, intermetallic compound (IMC) formation on the chip interface is avoided. The concern of solder diffusion and interaction with the thin films on the chip is also eliminated. In addition, failure is unlikely to happen on the chip interface since Cu mechanical properties are much better than solder. The pillar structure can also be engineered such that stress concentration and shear strain on solder is reduced.

Figure 2:
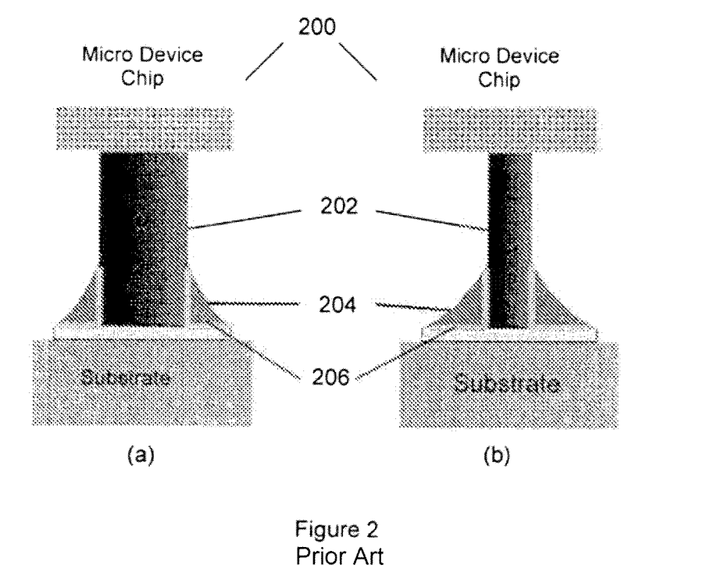
FIGS. 2a and 2b show a schematic drawing of a conventional pillar interconnect design with a larger and a smaller pillar diameter respectively.

FIGS. 2a and 2b show a schematic drawing of a conventional pillar interconnect design 200 with a larger and a smaller pillar diameter respectively. A key issue of the conventional pillar interconnect design 200 is that the solder volume 204 and its wetting surface 206 vary as the diameter of the pillar 202 changes. The pillar 202 with a smaller diameter, as shown in FIG. 2b, increases compliance as compared to the pillar 202 with a larger diameter, as shown in FIG. 2a. However, the wetting surface 206 decreases when the diameter of the pillar 202 becomes smaller. A decrease in the wetting surface 206 may affect joint reliability. In addition, solder bumping cannot be done on a device with varying pillar diameters as this will result in non-planarity.

Hence, there is a need to provide an alternative interconnect structure, and method which seek to address at least one of the above-mentioned problems.

SUMMARY

In accordance with a first aspect of the present invention, there is provided an interconnect structure comprising: a base portion formed on a mounting surface of a first component; a pillar portion extending from the base portion and substantially perpendicularly to the mounting surface; and a head portion formed on the pillar portion and having larger lateral dimensions than the pillar portion; wherein the base portion and the pillar portion are integrally formed of a homogeneous material.

The base portion may have larger lateral dimensions than the pillar portion.

The base portion, the pillar portion and the head portion may be integrally formed of the homogeneous material.

The interconnect structure may further comprise an intermediate layer formed between the head portion and the pillar portion, the intermediate layer comprising materials other than the homogenous material.

The intermediate layer may comprise TiW and Cu, Ti and Cu, or Cr and Cu.

The base portion may be formed on a contact layer formed on the mounting surface of the first component.

The contact layer may comprise TiW and Cu, Ti and Cu, or Cr and Cu

The homogenous material may comprise a metal or a conducting material suitable for electroplating.

The metal may comprise one or more of a group consisting of Cu, Ni, and Au.

The pillar portion and the head portion may have a same cross sectional shape.

The pillar portion and the head portion may have a different cross sectional shape.

The pillar portion and the base portion may have a same cross sectional shape.

The pillar portion and the base portion may have a different cross sectional shape.

The head portion and the base portion may have a same cross sectional shape.

The head portion and the base portion may have a different cross sectional shape.

The head portion may have a surface disposed for facing a second component to which the first component is to be mounted.

The surface may be convex.

The surface may be planar.

A dielectric or passivation layer may be deposited on the first component and such that the pillar portion and the base portion are either encapsulated or remain exposed.

At least one of the base portion, the pillar portion and the head portion may be uniformly coated or selectively coated with one or more selected from a group consisting of a wetting layer, a diffusion barrier layer and a oxidation resistant layer.

In accordance with a second aspect of the present invention, there is provided an interconnect structure for interconnecting first and second components, the interconnect structure comprising: a base portion formed on a mounting surface of the first component; a pillar portion extending from the base portion and substantially perpendicularly to the mounting surface; and a head portion formed on the pillar portion and having larger lateral dimensions than the pillar portion; a contact pad formed on a mounting surface of the second component; and a connection for connecting the head portion of the interconnect structure to the contact pad; wherein the base portion and the pillar portion are integrally formed of a homogeneous material.

The connection for connecting the head portion of the interconnect structure to the contact pad may comprise one or more of a group consisting of solder, adhesive bonding, surface activated bonding, compression bonding and diffusion bonding.

A solder bump may be formed between facing surfaces of the head portion and the contact pad respectively.

The head portion and the contact pad may be substantially encapsulated by solder.

In accordance with a third aspect of the present invention, there is provided an interconnect structure for interconnecting a multiple component stack and a substrate, the interconnect structure comprising: a first base portion formed on a first mounting surface of a first component of the stack; a first pillar portion extending from the first base portion and substantially perpendicularly to the first mounting surface; and a second head portion formed on the second pillar portion and having larger lateral dimensions than the second pillar portion; a second base portion formed on a second mounting surface of a second component of the stack; a second pillar portion extending from the second base portion and substantially perpendicularly to the second mounting surface; and a second head portion formed on the second pillar portion and having larger lateral dimensions than the second pillar portion; a first and a second contact pad formed on a mounting surface of the substrate; and a connection for connecting the head portions to the respective contact pads respectively; wherein the base portions and the pillar portions are integrally formed of a homogeneous material pillar and the first pillar portion is higher than the second pillar portion.

The interconnect structure may further comprise a spacer disposed between the first and second components of the stack.

The connection for connecting the head portion of the interconnect structure to the contact pad may comprise one or more of a group consisting of solder, adhesive bonding, surface activated bonding, compression bonding and diffusion bonding.

In accordance with a fourth aspect of the present invention, there is provided a method of fabricating an interconnect structure, the method comprising: forming a base portion on a mounting surface of a first component; forming a pillar portion, the pillar portion extending from the base portion and substantially perpendicularly to the mounting surface; and forming a head portion on the pillar portion, the head portion having larger lateral dimensions than the pillar portion; and integrally forming the base portion and the pillar portion with a homogeneous material.

The method may further comprise forming the pillar portion and the head portion using different masks in a photolithography process.

The step of forming the pillar portion and the head portion may comprise an imprinting process A mould for the imprinting process may be patterned and may comprise polymer, composite or metal materials.

The method may further comprise forming an intermediate layer between the head portion and the pillar portion.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 3a shows a schematic drawing of an assembly of a micro device chip and a substrate, which are connected by a pin-head interconnect structure and a solder bump, according to an example embodiment.

FIG. 3b shows a schematic drawing of the assembly with a pin-head interconnect structure having a smaller diameter as compared to that shown in FIG. 3a.

FIG. 4a shows a schematic drawing of the pin-head interconnect of FIG. 3.

FIGS. 4b and 4c show schematic drawings of variations of the pin-head interconnect of FIG. 4a.

FIG. 4d shows a schematic drawing of a variation of the pin-head interconnect of FIG. 4b.

FIGS. 4e to 4g show top sectional views of the pin-head interconnect having different designs of horizontal portions.

DETAILED DESCRIPTION

The embodiments described herein provide an interconnect structure to overcome the inherent weaknesses in solder bump interconnection. The embodiments also provide an improved interconnect structure to overcome the current limitations that metal interconnects and solder bumps have in micro devices packaging or integration.

FIG. 3a shows a schematic drawing of an assembly 300 of a micro device chip 302 and a substrate 304, which are connected by a pin-head interconnect structure 306 and a solder bump 308. A base material of the micro device chip 302 can be, for example but not limited to, semiconductor materials such as silicon, ceramic, glass or polymer materials, or the like. The base material of the micro device chip 302 can be passivated with dielectric materials, metallized, patterned and circuited with channels, metal traces and pads, The pin-head interconnect 306 comprises a substantially vertical pillar portion 310 and a substantially horizontal head portion 312. The head portion 312 is disposed at one end of the pillar portion 310. The other end of the pillar portion 310 of the pin-head interconnect 306, i.e. the end opposite that having the head portion 312, is in contact with a micro device chip 302. The solder bump 308 is deposited between the head portion 312 and a metal pad 314 of a substrate 304. The pillar portion 310 and the head portion 312 of the pin-head interconnect 306 are made of a homogeneous metal. One example of the homogeneous metal is copper. It is preferred that the solder bump 308 is lead-free. The substrate 304 can be made of any polymer, composite or inorganic materials such as polyimide, glass-epoxy, ceramic or silicon etc. It will be appreciated by a person skilled in the art that other materials can be used for the micro device chip 302, the pin-head interconnect 306, the solder bump 308 and the substrate 304 in other embodiments.

FIG. 3b shows a schematic drawing of the assembly 300 with a pillar portion 310 of a pin-head interconnect 306 having a smaller width 316 as compared to that of FIG. 3a. By comparing FIGS. 3a and 3b, it can be observed that the size of the solder bump 308 does not change when the width 316 of the pillar portion 310 of the pin-head interconnect 306 decreases. Further, the assembly 300 advantageously allows a variation of a width to height aspect ratio of the pillar portion 310 of the pin-head interconnect 306 to increase compliance of the assembly 300, without changing the solder bump size. This advantageously reduces the local shear strain on the interconnection due to coefficient of thermal expansion (CTE) mismatch between the micro device chip 302 and the substrate 304. The pin-head interconnect 306 advantageously allows standard solder pads and solder bumps to be used on the micro device chip 302 even if the widths 316 of the pillar portions 310 of the pin-head interconnects 306 across the micro device chip 302 are varied to give an optimal compliance at different locations of the micro device chip 302.

Figure 3:
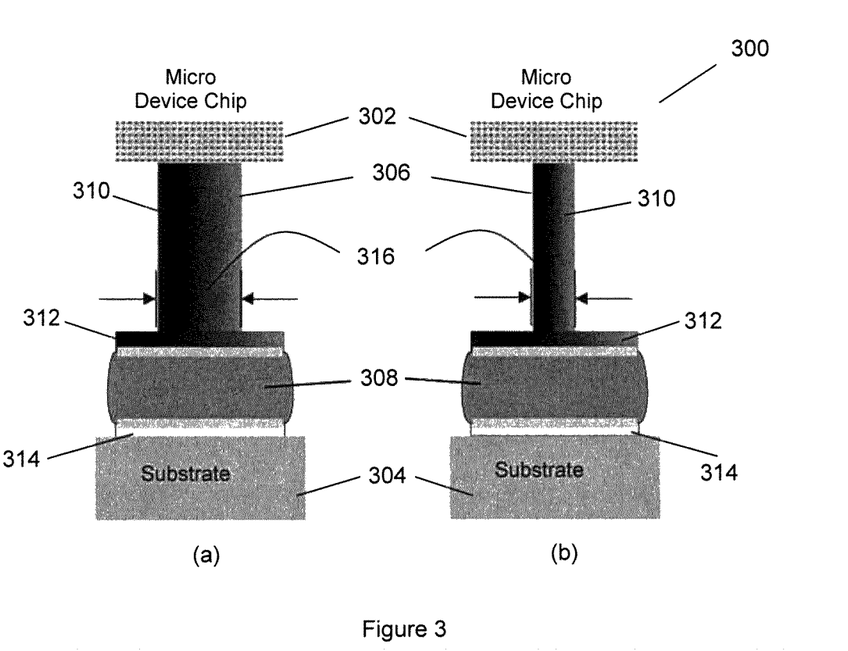
Figure 4:
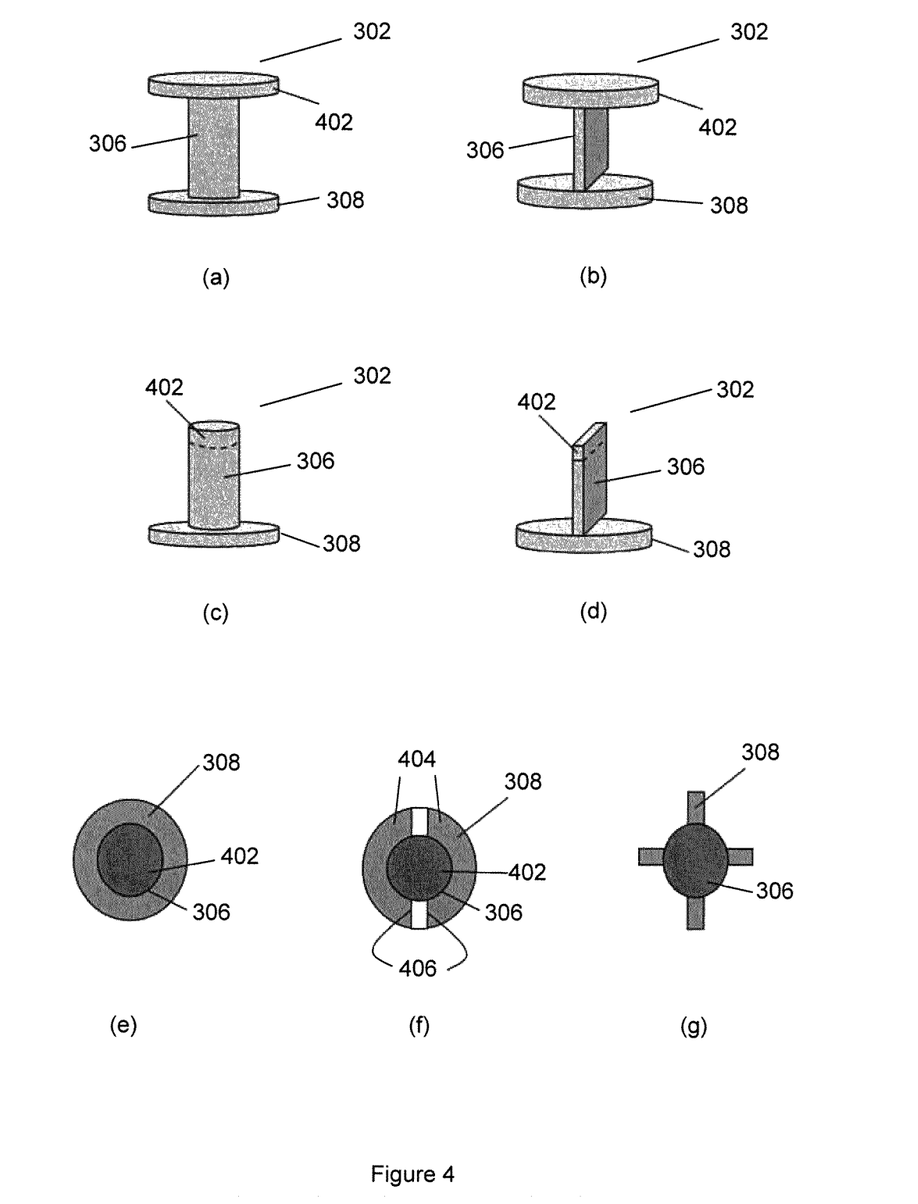

FIG. 4a shows a schematic drawing of the pin-head interconnect 302 of FIG. 3. The pin-head interconnect 302 comprises a substantially round pillar portion 306. The pin-head interconnect 302 further comprises a head portion 308 and a substantially horizontal base portion 402. The head portion 308 and the base portion 402 are disposed at respective ends of the pillar portion 306. FIG. 4b shows a schematic drawing of a variation of the pin-head interconnect 302 of FIG. 4a. In this embodiment, the pin-head interconnect 302 has a substantially rectangular vertical portion 306.

In the embodiments of FIGS. 4a and 4b, the head portion 308 and the base portion 402 of the pin-head interconnect 302 have larger lateral dimensions than the pillar portion 306. The head portion 308 and the base portion 402 have a same cross-sectional shape. The pillar portion 306 has a different cross-sectional shape as compared to those of the head portion 308 and the base portion 402.

FIG. 4c shows a schematic drawing of a variation of the pin-head interconnect 302 of FIG. 4a. FIG. 4d shows a schematic drawing of a variation of the pin-head interconnect 302 of FIG. 4b. In the embodiments of FIGS. 4c and 4d, the pin-head interconnect 302 can be considered to include a base portion 402 having same lateral dimensions and cross-sectional shape as the pillar portion 306. The head portion 308 has larger lateral dimensions than the pillar portion 306 and the base portion 402. The head portion 308 has a different cross-sectional shape as compared to those of the pillar portion 306 and the base portion 402.

FIG. 4e shows a top sectional view of the pin-head interconnect 302 having a substantially round pillar portion 306 and a substantially round base portion 402 and a substantially round head portion 308. FIGS. 4f and 4g show top sectional views of the pin-head interconnect 302 with a round pillar portion 306 and a round base portion 402 but different designs of the head portion 308. In FIG. 4f, the head portion 308 comprises two semi-circular elements 404. The semi-circular elements 404 are spaced apart and are arranged such that the respective straight edges 406 face each other and are aligned from one end to the other end. In FIG. 4g, the head portion 308 is substantially cross shaped. In FIGS. 4e, 4f and 4g, the pillar portion 306 is disposed substantially in the centre of the head portion 308.

In the embodiments of FIGS. 4e, 4f and 4g, the pillar portion 306 has the same lateral dimensions and cross-sectional shape as the base portion 402. The head portion 308 has larger lateral dimensions than the pillar portion 306 and the base portion 402. The head portion 308 has a different cross-sectional shape as compared to those of the pillar portion 306 and the base portion 402. As appreciated by a person skilled in the art, the designs of the pillar portions 306, the head portions 308 and the base portions 402 of the pin-head interconnect 302 are not restricted to the examples as described above.

Figure 5:
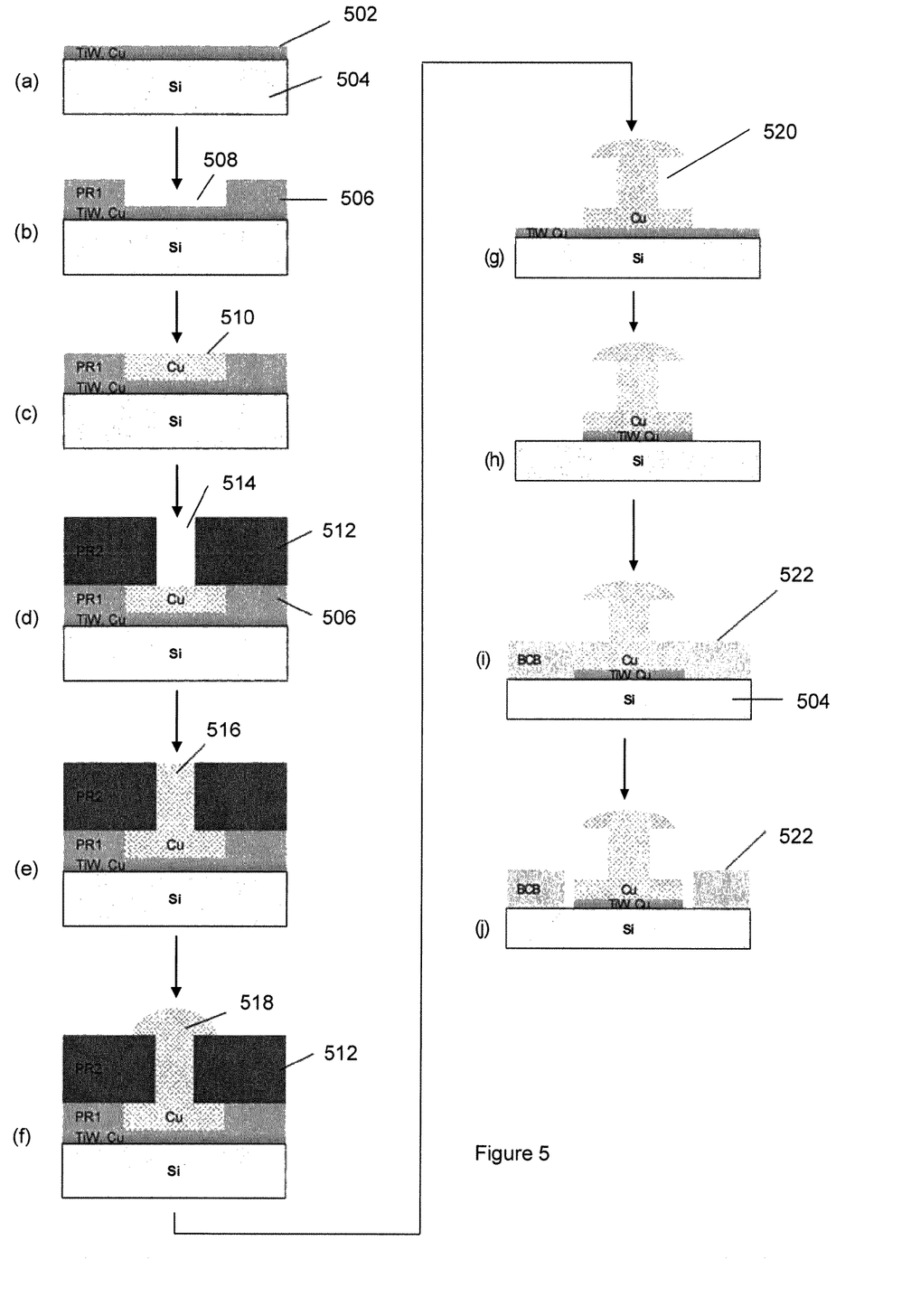
FIGS. 5a to 5j show a process flow for fabricating a pin-head interconnect using photolithography-plating, according to an example embodiment.

Two example methods, namely photolithography-plating and imprinting-plating, that can be used for manufacturing pin-head interconnects will now be described. FIGS. 5a to 5j show a process flow for fabricating a pin-head interconnect using photolithography-plating. FIG. 5a shows a schematic diagram of a mounting surface in the form of an adhesion and seed layer 502 is deposited on a silicon (Si) chip 504. In this embodiment, the adhesion layer is about 100 to about 1000 angstrom and the seed layer is about 1000 to about 5000 angstrom. Titanium-tungsten (TiW) and copper (Cu) are used for the adhesion and seed layer 502. Depending on the base material of the chip, Ti and Cu or chromium (Cr) and Cu can also be used for the adhesion and seed layer 502 in other embodiments. A first photoresist (PR1) layer 506 is deposited on the adhesion and seed layer 502. A mask with a pattern (not shown) is placed above the PR1 layer 506. After the PR1 layer 506 is exposed to ultraviolet (UV) light through the patterned mask, a patterned opening 508 is formed as shown in FIG. 5b. A copper layer 510 is deposited in the opening 508 by e.g. electroplating, which is shown in FIG. 5c. In this embodiment, the thickness of the copper layer 510 is about 1.0 to about 10 micron.

The process of forming the copper layer 510 illustrated in FIGS. 5a to 5c is comparable to a process of forming a conventional chip pad. The copper chip pad 510 forms a base portion of a pin-head interconnect. This advantageously allows the pin-head interconnect to be plated directly on the copper chip pad. This advantageously provides an ease of integration of manufacturing an array of pin-head interconnects at a wafer level.

FIG. 5d shows a schematic diagram of a second photoresist (PR2) layer 512 deposited on the PR1 layer 506 with an opening 514 formed. The opening 514 is formed in the PR2 layer 512 with conventional photolithography processes. A copper layer 516 is deposited in the opening 514 by e.g. electroplating, as shown in FIG. 5e. The copper layer 516 forms a pillar portion of a pin-head interconnect. The height to diameter aspect ratio of the pillar portion is preferably about 0.5 to about 4.0. A copper layer 518 having a convex surface is deposited in the opening 514 by e.g. electroplating, as shown in FIG. 5f. The convex copper layer 518 is formed due to isotropic copper ion deposition on the pillar portion 516 above the PR2 layer 512. The convex copper layer 518 forms a head portion of a pin-head interconnect. FIG. 5g shows that a convex pin-head interconnect 520 made of Cu is formed after electroplating. The PR1 layer 506 and PR2 layer 512 are removed. FIG. 5h shows that portions of the adhesion and seed layer 502 which extend beyond the copper layer 510 are removed. FIG. 5i shows that a dielectric or passivation layer 522 is deposited on the silicon chip 504. Benzocyclobutene (BCB) can be used for the dielectric or passivation layer 522 in this embodiment. The dielectric or passivation layer 522 encapsulates the base portion and part of the pillar portion of the pin-head interconnect 520. FIG. 5j shows that portions of the dielectric or passivation layer 522 are removed. The dielectric or passivation layer 522 encapsulating the base portion and part of the pillar portion of the pin-head interconnect 520 can be removed by using conventional photolithography processes if a photoimageable layer 522 is used in this embodiment.

In other embodiments, it is possible to end the process of manufacturing the pin-head interconnect at FIG. 5i. The step of removing some portions of the dielectric or passivation layer 522 can produce metal-pad-defined interconnect structures.

Figure 6:
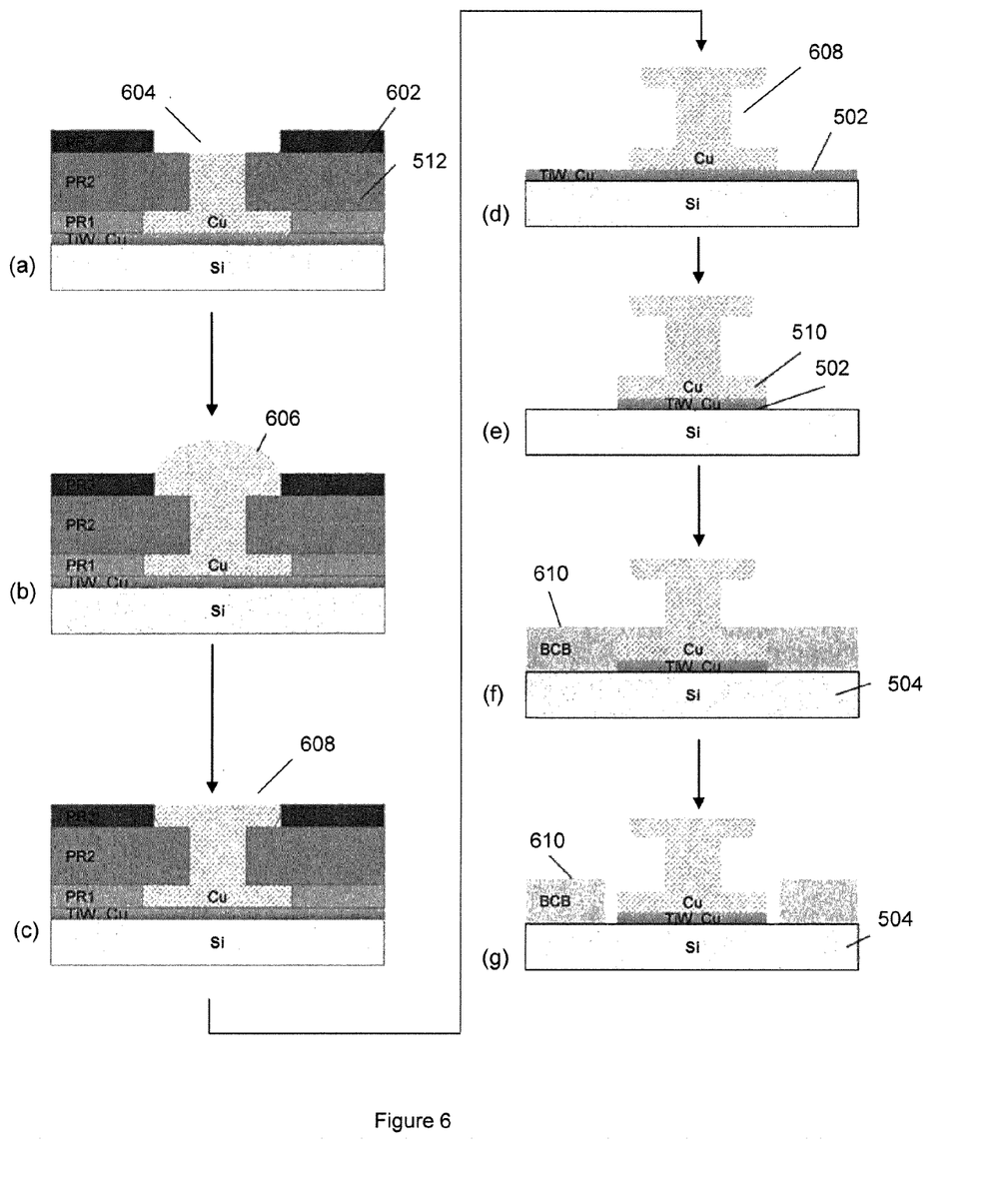
FIGS. 6a to 6g show a continuation of a process for fabricating the pin-head interconnect using photolithography-plating from FIG. 5e.
Figure 7:
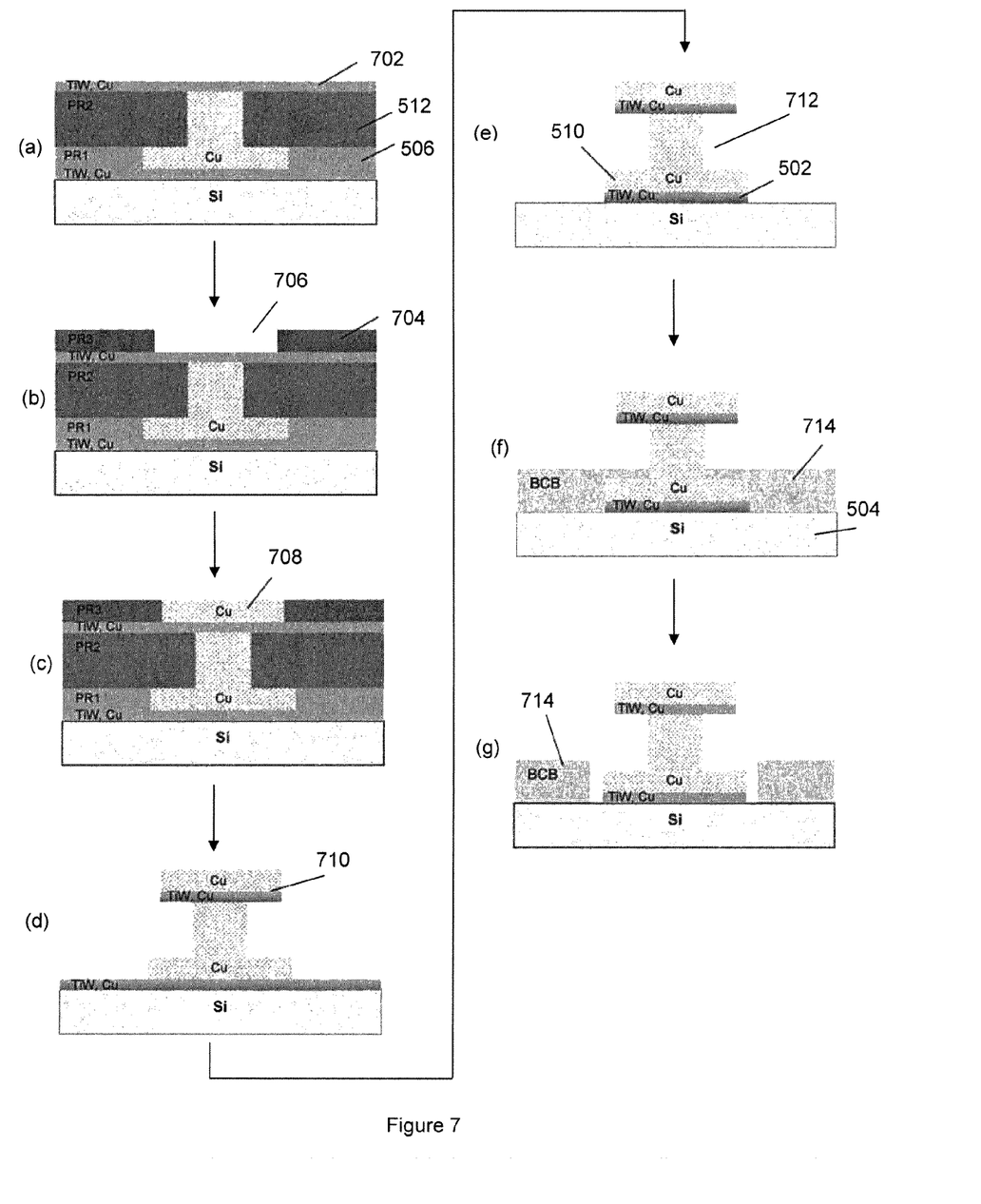
FIGS. 7a to 7g show an alternative continuation of a process for fabricating the pin-head interconnect using photolithography-plating from FIG. 5e.

Alternatively, after the copper layer 516 is deposited in the gap 514 as shown in FIG. 5e, a third photoresist (PR3) layer 602 can be deposited on the PR2 layer 512 (as shown in FIG. 6a) or an adhesion and seed layer 702 can be deposited on the PR2 layer 512 (as shown in FIG. 7a).

With reference to FIG. 6a, a third photoresist (PR3) layer 602 is deposited on the PR2 layer 512, an opening 604 is formed in the PR3 layer 602 with conventional photolithography processes. A copper layer 606 having a convex surface is deposited in the opening 604 by e.g. electroplating, as shown in FIG. 6b. The convex surface of the copper layer 606 is formed due to isotropic copper ion deposition. The PR3 layer 602 serves to constrain and define the formation and growth of the convex copper layer 606 according to the patterned opening 604. The copper layer 606 forms a head portion of a pin-head interconnect. The copper layer 606 can be planarized to produce a flat pin-head using chemical, mechanical or chemical-mechanical means before PR3 layer 602 is removed.

FIG. 6c shows that a pin-head interconnect 608 made of Cu with a planarized copper layer 606 after planarization. FIG. 6d shows that the PR1 layer 506, the PR2 layer 512 and the PR3 layer 602 are removed. FIG. 6e shows that portions of the adhesion and seed layer 502 which extend beyond the copper layer 510 are removed. FIG. 6f shows a dielectric or passivation layer 610 deposited on the silicon chip 504. In this embodiment, benzocyclobutene (BCB) is used for the dielectric or passivation layer 610. The dielectric or passivation layer 610 encapsulates the base portion and part of the pillar portion of the pin-head interconnect 608. FIG. 6g shows that portions of the dielectric or passivation layer 610 encapsulating the base portion and part of the pillar portion of the pin-head interconnect 608 are removed. The dielectric or passivation layer 610 can be removed by using conventional photolithography processes if a photoimageable layer 610 is used in this embodiment.

In other embodiments, it is possible to end the process of manufacturing the pin-head interconnect at FIG. 6f. The step of removing some portions of the dielectric or passivation layer 610 can produce metal-pad-defined interconnect structures.

With reference to FIG. 7a, where an adhesion and seed layer 702 is deposited on the PR2 layer 512, a third photoresist (PR3) layer 704 is deposited on the layer 702. Titanium-tungsten (TiW) and copper (Cu) are used for the adhesion and seed layer 702. Depending on the base material of the chip, Ti and Cu or chromium (Cr) and Cu can also be used for the adhesion and seed layer 702 in other embodiments. An opening 706 is formed in the PR3 layer 704, as shown in FIG. 7b, with conventional photolithography processes. A copper layer 708 having a substantially planar surface is deposited in the opening 706, as shown in FIG. 7c. FIG. 7d shows that the PR1 layer 506, the PR2 layer 512 and the PR3 layer 704 are removed. The portions of the adhesion and seed layer 702 which extend beyond the copper layer 708 are removed. The adhesion and seed layer 702 and the copper layer 708 form a head portion 710 of a pin-head interconnect. FIG. 7e shows that portions of the adhesion and seed layer 502 which extend beyond the copper layer 510 are removed. A pin-head interconnect 712 made of Cu is formed. FIG. 7f shows a dielectric or passivation layer 714 deposited on the silicon chip 504. In this embodiment, benzocyclobutene (BCB) is used for the dielectric or passivation layer 714. The dielectric or passivation layer 714 encapsulates the base portion and part of the pillar portion of the pin-head interconnect 712. FIG. 7g shows that portions of the dielectric or passivation layer 714 encapsulating the base portion and part of the pillar portion of the pin-head interconnect 712 are removed. The dielectric or passivation layer 714 can be removed by using conventional photolithography processes if a photoimageable layer 714 is used in this embodiment.

In other embodiments, it is possible to end the process of manufacturing the pin-head interconnect at FIG. 7f. The step of removing some portions of the dielectric or passivation layer 714 can produce metal-pad-defined interconnect structures.

Figure 8:
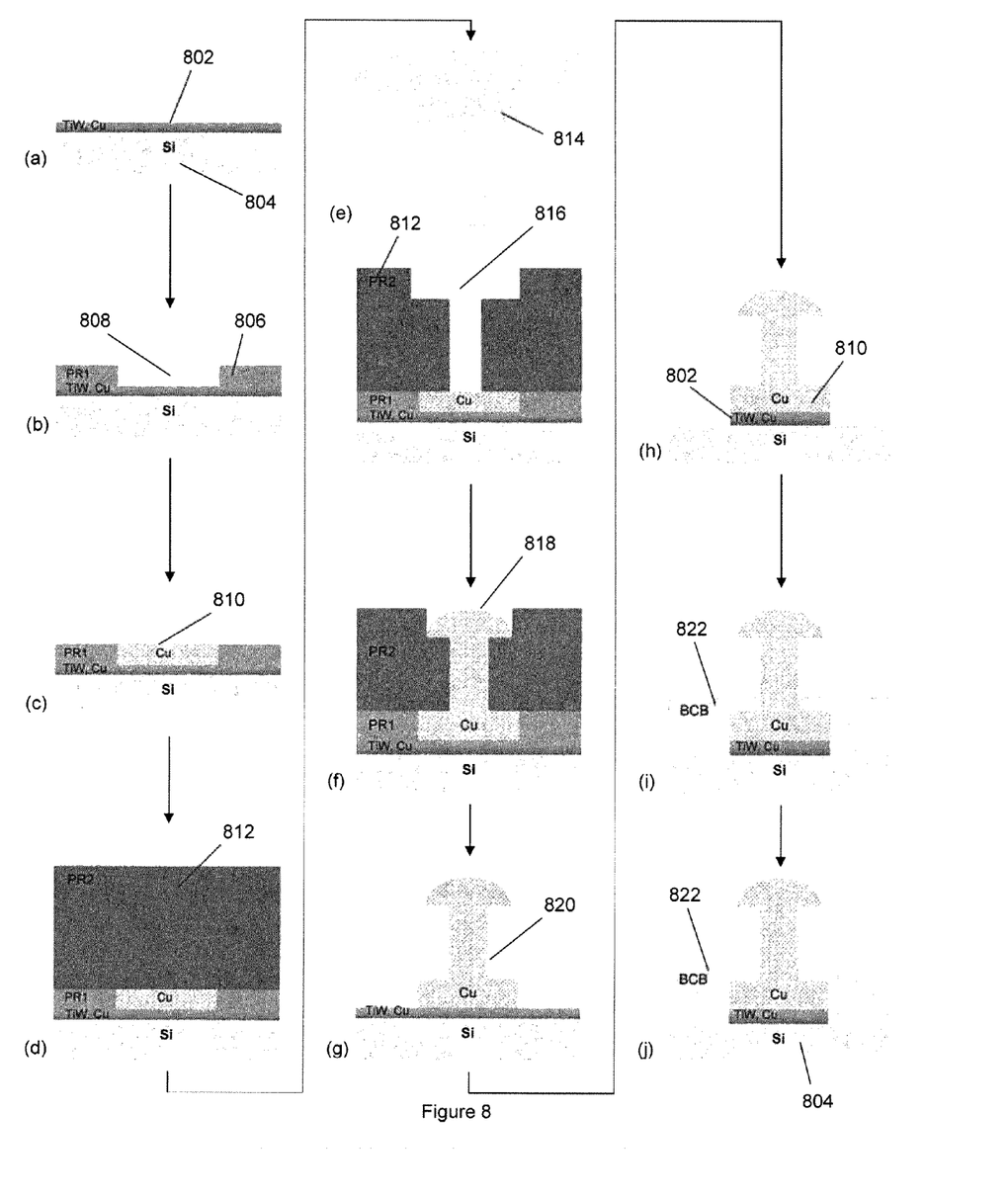
FIGS. 8a to 8j shows a process flow for fabrication of a pin-head interconnect using low cost imprinting-plating process, according to an example embodiment.

FIGS. 8a to 8j shows a process flow for fabrication a pin-head interconnect using low cost imprinting-plating process. FIG. 8a shows a schematic diagram of a mounting surface in the form of an adhesion and seed layer 802 deposited on a silicon (Si) chip 804. Titanium-tungsten (TiW) and copper (Cu) are used for the adhesion and seed layer 802. Depending on the base material of the chip, Ti and Cu or chromium (Cr) and Cu can also be used for the adhesion and seed layer 802 in other embodiments. A first photoresist (PR1) layer 806 is deposited on the adhesion and seed layer 804. An opening 808 is formed in the PR1 layer 806, as shown in FIG. 8b, with conventional photolithography processes. Alternatively, the PR1 layer 806 can be a non photosensitive polymer resist which is imprinted with a patterned mould and plasma ashed to produce the opening 808. A copper layer 810 is deposited in the opening 808 by e.g. electroplating, which is shown in FIG. 8c.

The process of forming the copper layer 810 illustrated in FIGS. 8a to 8c is comparable to a process of forming a conventional chip pad. The copper chip pad 810 forms a base portion of a pin-head interconnect. This advantageously allows the pin-head interconnect to be plated directly on the copper chip pad. This advantageously provides an ease of integration of the manufacturing an array of pin-head interconnects at a wafer level.

FIG. 8d shows a schematic diagram of a second polymer resist (PR2) layer 812 deposited on the PR1 layer 806. An imprinting mould 814 is used to form a cavity 816 in the PR2 layer 812, as shown in FIG. 8e. The imprinting mould 814 is made of nickel in this embodiment. Other polymer, composite or metal materials can be used to fabricate the mould 814 in different embodiments. The residues of the PR2 layer 812 at the bottom of the cavity 816 can be removed by plasma ashing followed by wet chemical cleaning. The mould imprinting process enables high aspect ratio openings to be formed on a thick polymer resist. As shown in FIG. 8e, a cavity with a complex geometry can be formed in one imprinting step. Copper is deposited into the cavity 816 by e.g. electroplating and the copper layer 818 has a convex pin-head surface, as shown in FIG. 8f. The convex surface of the copper layer 818 is formed due to isotropic copper ion deposition. In this embodiment, the copper layer 818 forms a pillar portion and a head portion of a pin-head interconnect. The convex pin-head can be planarized using chemical, mechanical or chemical-mechanical planarizing processes before the removal of the PR2 layer 812 in other embodiments.

FIG. 8g shows that a pin-head interconnect 820 made of Cu is formed. The PR1 layer 806 and the PR2 layer 812 are removed. FIG. 8h shows that portions of the adhesion and seed layer 802 which extend beyond the copper layer 810 are removed. FIG. 8i shows a dielectric or passivation layer 822 deposited on the silicon chip 804. In this embodiment, benzocyclobutene (BCB) is used for the dielectric or passivation layer 822. The dielectric or passivation layer 822 encapsulates the base portion and part of the pillar portion of the pin-head interconnect 820. FIG. 8j shows that portions of the dielectric or passivation layer 822 encapsulating the base portion and part of the pillar portion of the pin-head interconnect 820 are removed. The dielectric or passivation layer 822 can be removed by using conventional photolithography processes if a photoimageable layer 822 is used in this embodiment.

In other embodiments, it is possible to end the process of manufacturing the pin-head interconnect at FIG. 8i. The step of removing some portions of the dielectric or passivation layer 822 can produce metal-pad-defined interconnect structures.

In the above described photolithography-plating and imprinting-plating processes, the formation of the pin-head interconnect can be viewed as the formation of a modified chip interconnect structure. Further, parts including the base portion, the pillar portion and the head portion of the interconnect structures can be uniformly or selectively treated or coated to enhance their wetting, diffusion and oxidation resistant behaviour. Nickel, for example, is commonly used as a diffusion barrier layer and gold as an oxidation resistant layer. These metals can be deposited on the interconnect structures by sputtering or electroplating processes. The pin-head interconnect structures can be advantageously fabricated at the wafer level. The micro devices can be assembled on a substrate with or without underfill encapsulation.

Further, copper is used to form the base portions and the pillar portions of the pin-head interconnects described above. In other embodiments, nickel or gold can be used for forming the base portion and the pillar portion. In such embodiments, the adhesion and seed layer may comprise nickel or gold.

In the above described photolithography-plating and imprinting-plating processes, the pin-head interconnects are first formed on the silicon chip and substrates are then brought into contact with the pin-head interconnects. In other embodiments, the pin-head interconnects can be first formed on the substrates and the silicon chips are then brought into contact with the pin-head interconnects.

Figure 9A:
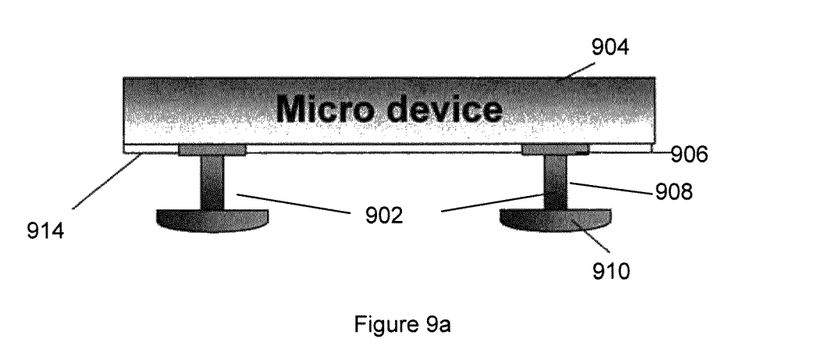
FIG. 9a show a schematic drawing of pin-head interconnects connected to a micro device.

FIG. 9a show a schematic drawing of pin-head interconnects 902 connected to a micro device 904. The micro device 904 can be any devices with electronic, optic, fluidic or micro-electro-mechanical functions or a combination of these functions. The pin-head interconnects 902 comprise a base portion 906, a pillar portion 908 and a head portion 910. The base portion 906 and the head portion 910 are disposed at respective ends of the pillar portion 908. A passivation layer 914 of the micro device 904 can be of photoimageable or non-photoimageable material.

In this embodiment, the base portion 906 and the head portion 910 have larger lateral dimensions than the pillar portion 906. The head portion 910 has larger lateral dimensions than the base portion 906. The base portion 906, the pillar portion 908 and the head portion 910 have different cross-sectional areas. The base portion 906 surface is substantially planar and the head portion 910 has a curved surface.

Figure 9B:
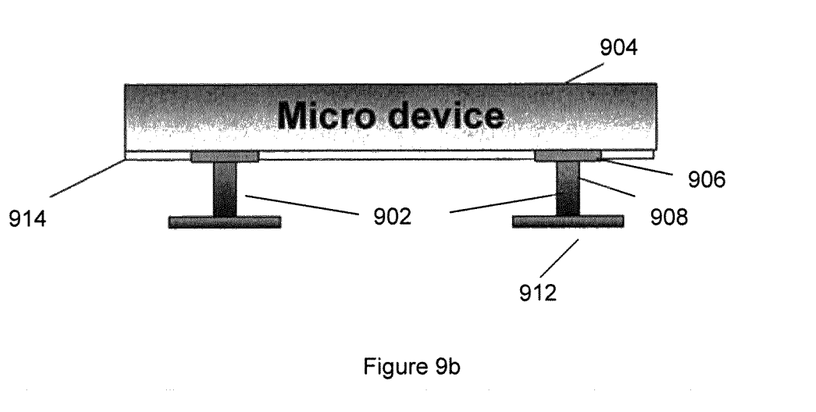
FIG. 9b show a schematic drawing of planarized pin-head interconnects connected to the micro device.

FIG. 9b show a schematic drawing of another example of pin-head interconnects 902 of FIG. 9a connected to the micro device 904. The head portion 912 of the pin-head interconnects 902 have a substantially planar surface.

Figure 10A:
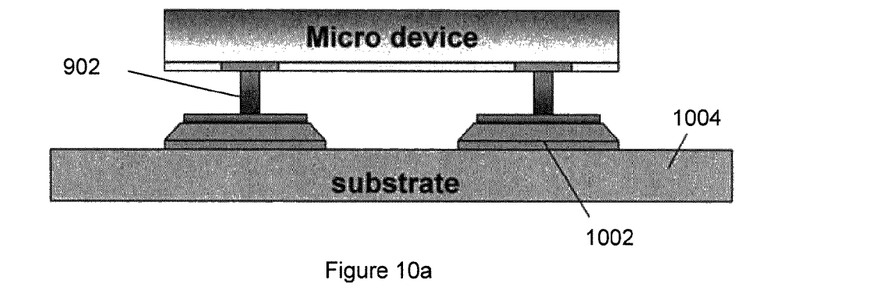
FIGS. 10a to 10c show schematic drawings of one micro device interconnected to a substrate using different interconnect structures embodying the present invention.
Figure 10B:
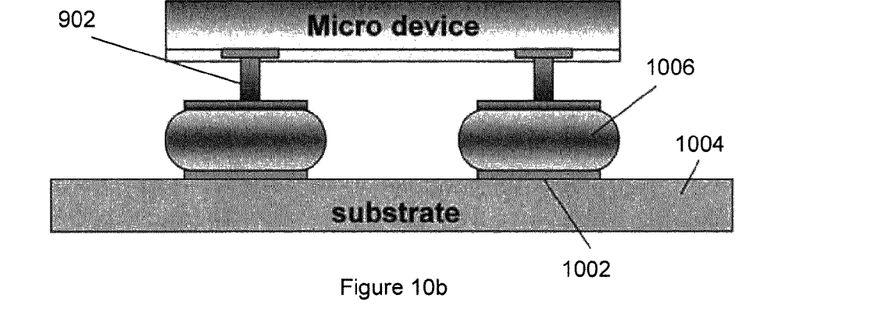
Figure 10C:
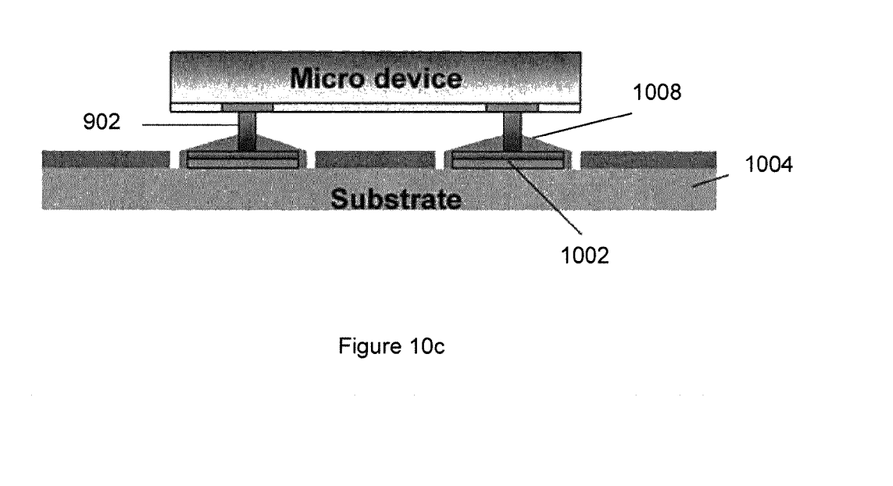

FIGS. 10a, 10b and 10c show schematic drawings of one micro device 904 interconnected to a substrate 10. In FIG. 10a, the pin-head interconnects 902 of FIG. 9b are connected to metal pads 1002 of a substrate 1004 using methods, e.g. solder, adhesive bonding, indirect bonding or direct bonding. In FIG. 10b, the pin-head interconnects 902 of FIG. 9b are connected to the metal pads 1002 of the substrate 1004 using solder bumps 1006. The solder bumps 1006 can be preformed on either the pin-head interconnects 902 or the metal pads 1002 before the pin-head interconnects 902 and the substrate 1004 are brought together. In FIG. 10c, the pin-head interconnects 902 of FIG. 9b are connected to the embedded metal pads 1002 of the substrate 1004 by solders 1008 or other attachment methods like adhesive bonding, surface activated bonding, compression bonding or diffusion bonding. The embedded metal pads 1002 are formed within the cavities of the substrate 1012. The head portions 912 of the pin-head interconnects 902 are fully encapsulated by solders 1008. Alternatively, the horizontal portions 912 of the pin-head interconnects 902 can be partially encapsulated by the solders 1008.

Figure 11A:
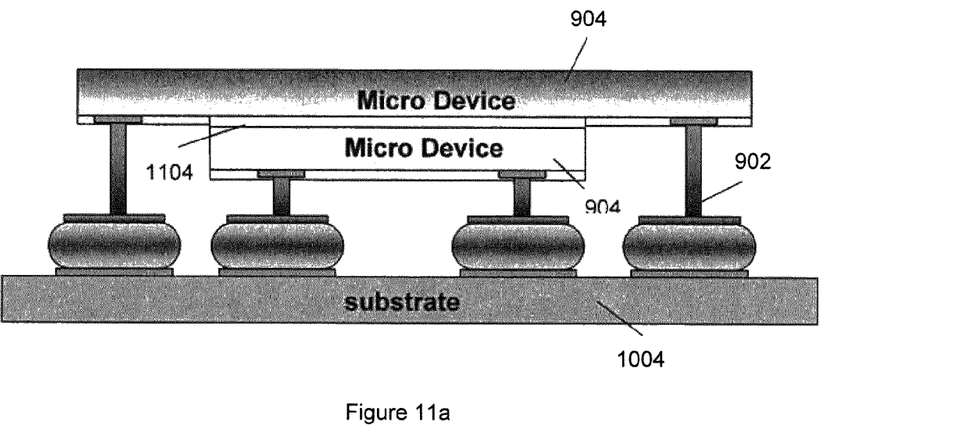
FIGS. 11a and 11b show schematic drawings of two micro devices interconnected to the substrate using different interconnect structures embodying the present invention.
Figure 11B:
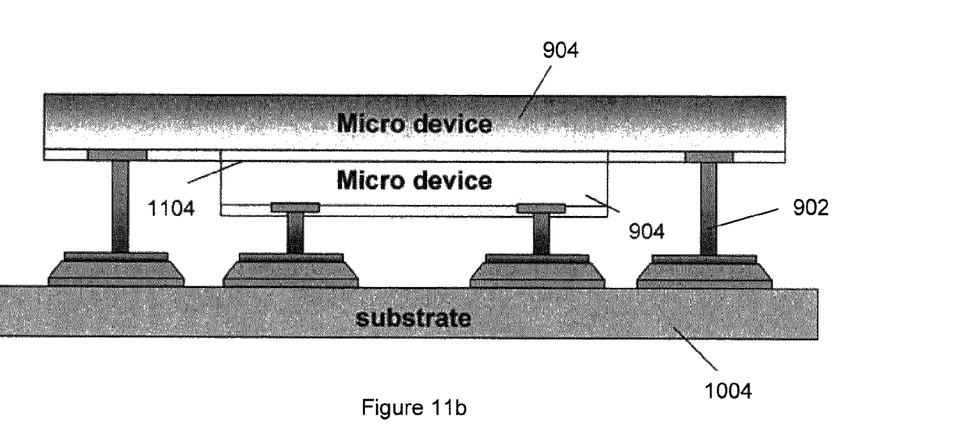

The pin-head interconnects can be used for joining, interconnecting or supporting micro devices 904 for purposes of packaging and integration. FIGS. 11a and 11b show schematic drawings of two micro devices 904 interconnected to the substrate 1004. In FIG. 11a, the pin-head interconnects 902 are connected to the metal pads 1002 of the substrate 1004 using methods, e.g. solder, adhesive, surface activated, compression or diffusion bonding. In FIG. 11b, the pin-head interconnects 902 are connected to the metal pads 1002 of the substrate 1004 using solder bumps 1006. A spacer 1102 is disposed between the micro devices 904 in the embodiments. In other embodiments, more than two micro devices 904 can be interconnected to the substrate 1004.

With the pin-head interconnect design in the example embodiments, the Cu pin-head interconnect can advantageously be plated directly on a Cu metallized chip pad. Hence, UBM is no longer necessary on a chip pad. Designing and optimizing the interconnect reliability on the substrate side is less complex because the concern of thin film materials and active device interaction exist only on the chip side.

High current, coupled with the need to reduce the package size, lead to high heat generation within the package. The ability to design and structure Cu interconnect for specific locations on the same chip can advantageously enhance thermal performance significantly. As a chip size gets smaller and denser, high temperature and current density promote electromigration is a growing concern. Since the melting point of Cu is 1083° C., which is much higher in comparison to the melting point of most leaded or lead-free solder materials, the atomic diffusion of a Cu pin-head interconnect is advantageously much slower than most solder materials. Hence, electromigration is advantageously reduced in the Cu pin-head interconnect.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, it will be appreciated that in different embodiments, the base of the pillar structure is formed on a surface of the substrate, for connection of the pillar head to the chip. More generally, the interconnect structure can be applied between mounting surfaces of two components or elements to be interconnected, or between multi component stacks and a substrate, in different embodiments.

Furthermore, the homogenous material for the interconnect structure may comprise any metal or any conducting material suitable for electroplating, in different embodiments.

Furthermore, in other embodiments, the interconnect structure can be formed on any surface that can be subjected to electroplating for formation of the interconnect structure. Also, if the interconnect structure is to be formed on surfaces that cannot be subjected to electroplating, a seed plating layer may be deposited. An additional adhesion layer may be required if the seed layer cannot adhere directly to the base material of the surface.

In various embodiments, the interconnect structure can be fabricated by other electroplated metals like nickel or gold. The adhesion layer can be TiW, Ti or Cr and the seed layer for plating can be nickel or gold if a silicon, glass or ceramic substrate is used. For other materials like epoxy-glass fibre base, the seed or plating layer can be laminated on the base material.

The invention claimed is:

1. A micro device interconnect structure for interconnecting a multiple component stack and a substrate, the interconnect structure comprising:
   a first base portion formed on a first mounting surface of a first component of the stack;
   a first pillar portion extending from the first base portion and substantially perpendicularly to the first mounting surface; and
   a first head portion formed on the first pillar portion and having larger lateral dimensions than the first pillar portion;
   a second base portion formed on a second mounting surface of a second component of the stack;
   a second pillar portion extending from the second base portion and substantially perpendicularly to the second mounting surface; and
   a second head portion formed on the second pillar portion and having larger lateral dimensions than the second pillar portion;
   a first and a second contact pad formed on a mounting surface of the substrate; and
   a connection for connecting the first and second head portions to the first and second contact pads respectively;
   wherein the base portions and the pillar portions are integrally formed of a homogeneous material pillar and the first pillar portion is higher than the second pillar portion.

2. The interconnect structure of claim 1, further comprising a spacer disposed between the first and second components of the stack.

3. The interconnect structure of claim 1, wherein the connection for connecting the head portion of the interconnect structure to the contact pad comprises one or more of a group consisting of solder, adhesive bonding, surface activated bonding, compression bonding and diffusion bonding.

* * * * *